(12) United States Patent
Richter (10) Patent No.: US 6,885,951 B2
(45) Date of Patent: Apr. 26, 2005

(54) METHOD AND DEVICE FOR DETERMINING THE STATE OF FUNCTION OF AN ENERGY STORAGE BATTERY

(75) Inventor: Gerolf Richter, Hildesheim (DE)

(73) Assignee: VB Autobatterie GmbH, Hannor (DE)

( * ) Notice: Subject to any disclaimer, the term of this patent is extended or adjusted under 35 U.S.C. 154(b) by 54 days.

(21) Appl. No.: 10/384,367

(22) Filed: Mar. 7, 2003

(65) Prior Publication Data

US 2004/0024546 A1 Feb. 5, 2004

(30) Foreign Application Priority Data

Mar. 9, 2002 (DE) ......................................... 102 10 516

(51) Int. Cl.⁷ ................................................. G06F 9/06
(52) U.S. Cl. ............................. 702/63; 702/57; 702/58; 702/60
(58) Field of Search ............................... 702/57, 58, 60, 702/64, 65, 107, 183, 44, 45, 63, 178, 182; 320/132; 324/426; 429/163; 700/83

(56) References Cited

U.S. PATENT DOCUMENTS

| | | | |
|---|---|---|---|
| 3,906,329 A | 9/1975 | Bader | 320/44 |
| 4,153,867 A | 5/1979 | Jungfer et al. | 320/43 |
| 4,193,025 A | 3/1980 | Frailing et al. | 324/427 |
| 4,207,611 A | 6/1980 | Gordon | 364/580 |
| 4,322,685 A | 3/1982 | Frailing et al. | 324/429 |
| 4,595,880 A | 6/1986 | Patil | 324/427 |
| 4,642,600 A | 2/1987 | Gummelt et al. | 338/34 |
| 4,659,977 A | 4/1987 | Kissel et al. | 320/64 |
| 4,665,370 A | 5/1987 | Holland | 324/429 |
| 4,719,427 A | 1/1988 | Morishita et al. | 324/427 |
| 4,816,736 A | 3/1989 | Dougherty et al. | 320/17 |
| 4,876,513 A | 10/1989 | Brilmyer et al. | 324/427 |
| 4,888,716 A | 12/1989 | Ueno | 364/550 |
| 4,937,528 A | 6/1990 | Palanisamy | 324/430 |

(Continued)

FOREIGN PATENT DOCUMENTS

| | | |
|---|---|---|
| DE | 22 42 410 | 3/1973 |
| DE | 2 242 510 C3 | 4/1974 |

(Continued)

OTHER PUBLICATIONS

Intelec ' 88—Tenth International communicaitons Energy Conference, "A look at the Impedance of a Cell—S.L. DeBardelaben, New York Telephone Company," bearing a designation "Oct. 30–Nov. 2, 1988," (6 sheets).

Battery Alert, Ltd., "The Easy–to–Install Battery Deterioration Warning Device", 12 Volt Model (BA101) Advertisement (2 sheets).

(Continued)

Primary Examiner—Marc S. Hoff
Assistant Examiner—Felix Suarez
(74) Attorney, Agent, or Firm—Foley & Lardner LLP (57) ABSTRACT

In a method for determining the state of function SOF of an energy storage battery, in particular a starter battery for a motor vehicle, as the capability to supply at least one load with an amount of energy, by determining a characteristic value for the state of charge SOC of the energy storage battery and a characteristic value for the state of health SOH when an electrical load is applied to the energy storage battery, with state of health (SOH) being the suitability of the energy storage battery to emit a specific amount of energy to the at least one load while maintaining a minimum voltage, a characteristic value for the state of function (SOF) is determined by linking the characteristic values for the state of charge (SOC) and for the state of health (SOH).

20 Claims, 3 Drawing Sheets

U.S. PATENT DOCUMENTS

| | | |
|---|---|---|
| 4,943,777 A | 7/1990 | Nakamura et al. .......... 324/433 |
| 4,952,861 A | 8/1990 | Horn ........................... 320/23 |
| 5,002,840 A | 3/1991 | Klebenow et al. ............. 429/9 |
| 5,032,825 A | 7/1991 | Kuznicki .................... 340/636 |
| 5,055,656 A | 10/1991 | Farah et al. ................. 219/209 |
| 5,079,716 A | 1/1992 | Lenhardt et al. ............ 364/483 |
| 5,130,699 A | 7/1992 | Reher et al. ................ 340/661 |
| 5,159,272 A | 10/1992 | Rao et al. ................... 324/429 |
| 5,162,164 A | 11/1992 | Dougherty et al. ............ 429/9 |
| 5,204,610 A | 4/1993 | Pierson et al. ................ 320/15 |
| 5,223,351 A | 6/1993 | Wruck ........................... 429/9 |
| 5,280,231 A | 1/1994 | Kato et al. .................... 320/31 |
| 5,281,919 A | 1/1994 | Palanisamy ................ 324/427 |
| 5,316,868 A | 5/1994 | Dougherty et al. ............ 429/9 |
| 5,321,627 A | 6/1994 | Reher ........................ 364/483 |
| 5,352,968 A | 10/1994 | Reni et al. ................... 320/35 |
| 5,381,096 A | 1/1995 | Hirzel ........................ 324/427 |
| 5,404,129 A | 4/1995 | Novak et al. ................ 340/488 |
| 5,412,323 A | 5/1995 | Kato et al. .................. 324/429 |
| 5,416,402 A | 5/1995 | Reher et al. .................. 320/48 |
| 5,428,560 A | 6/1995 | Leon et al. .................. 364/578 |
| 5,439,577 A * | 8/1995 | Weres et al. ................ 204/268 |
| 5,488,283 A | 1/1996 | Dougherty et al. ........... 320/15 |
| 5,549,984 A | 8/1996 | Dougherty .................... 429/61 |
| 5,552,642 A | 9/1996 | Dougherty et al. ........ 307/10.3 |
| 5,563,496 A * | 10/1996 | McClure .................... 320/128 |
| 5,572,136 A | 11/1996 | Champlin ................... 324/426 |
| 5,578,915 A | 11/1996 | Crouch, Jr. et al. ............. 320/6 |
| 5,656,915 A * | 8/1997 | Eaves ........................ 320/118 |
| 5,680,050 A | 10/1997 | Kawai et al. ............... 324/427 |
| 5,698,965 A | 12/1997 | York .......................... 320/30 |
| 5,721,688 A | 2/1998 | Bramwell ................... 364/483 |
| 5,744,936 A | 4/1998 | Kawakami ................. 320/120 |
| 5,744,963 A | 4/1998 | Arai et al. .................. 324/427 |
| 5,761,072 A | 6/1998 | Bardsley, Jr. et al. ....... 364/483 |
| 5,773,977 A | 6/1998 | Dougherty ................. 324/429 |
| 5,808,367 A | 9/1998 | Akagi et al. ................... 290/40 |
| 5,808,445 A | 9/1998 | Aylor et al. ................. 320/132 |
| 5,818,116 A | 10/1998 | Nakae et al. ................. 290/38 |
| 5,818,333 A | 10/1998 | Yaffe et al. ................. 340/455 |
| 5,896,023 A | 4/1999 | Richter ....................... 320/104 |
| 5,898,292 A | 4/1999 | Takemoto et al. .......... 320/136 |
| 5,936,383 A | 8/1999 | Ng et al. ..................... 320/132 |
| 5,965,954 A | 10/1999 | Johnson et al. ............ 307/10.3 |
| 5,977,654 A | 11/1999 | Johnson et al. ............ 307/10.5 |
| 5,990,660 A | 11/1999 | Meissner .................... 320/127 |
| 6,016,047 A | 1/2000 | Notten et al. ............... 320/137 |
| 6,037,749 A | 3/2000 | Parsonage .................. 320/132 |
| 6,037,777 A | 3/2000 | Champlin ................... 324/430 |
| 6,057,666 A | 5/2000 | Dougherty et al. ......... 320/104 |
| 6,087,808 A | 7/2000 | Pritchard .................... 320/132 |
| 6,091,325 A | 7/2000 | Zur et al. ................... 340/455 |
| 6,118,252 A | 9/2000 | Richter ....................... 320/132 |
| 6,118,275 A | 9/2000 | Yoon et al. ................. 324/427 |
| 6,144,185 A | 11/2000 | Dougherty et al. ......... 320/132 |
| 6,160,382 A | 12/2000 | Yoon et al. ................. 320/136 |
| 6,222,341 B1 | 4/2001 | Dougherty et al. ......... 320/104 |
| 6,268,712 B1 | 7/2001 | Laig-Horstebrock et al. ........ 320/132 |
| 6,271,642 B1 | 8/2001 | Dougherty et al. ......... 320/104 |
| 6,296,593 B1 | 10/2001 | Gotou et al. ................ 477/176 |
| 6,300,763 B1 | 10/2001 | Kwok ........................ 324/427 |
| 6,304,059 B1 * | 10/2001 | Chalasani et al. .......... 320/118 |
| 6,331,762 B1 | 12/2001 | Bertness .................... 320/134 |
| 6,369,578 B1 | 4/2002 | Crouch, Jr. et al. ......... 324/426 |
| 6,388,421 B1 | 5/2002 | Abe ........................... 320/104 |
| 6,388,450 B1 | 5/2002 | Richter et al. .............. 324/427 |
| 6,392,389 B1 | 5/2002 | Kohler ....................... 320/152 |
| 6,392,414 B1 | 5/2002 | Bertness .................... 324/429 |
| 6,392,415 B1 | 5/2002 | Laig-Horstebrock et al. ........ 324/433 |
| 6,417,668 B1 | 7/2002 | Howard et al. ............. 324/426 |
| 6,424,157 B1 | 7/2002 | Gollomp et al. ............ 324/430 |
| 6,441,585 B1 | 8/2002 | Bertness .................... 320/132 |
| 6,445,158 B1 | 9/2002 | Bertness et al. ............ 320/104 |
| 6,452,361 B1 | 9/2002 | Dougherty et al. ......... 320/104 |
| 6,472,875 B1 | 10/2002 | Meyer ....................... 324/327 |
| 6,495,990 B1 | 12/2002 | Champlin ................... 320/132 |
| 6,507,194 B1 | 1/2003 | Suzuki ....................... 324/428 |
| 6,515,452 B1 | 2/2003 | Choo ......................... 320/132 |
| 6,515,456 B1 | 2/2003 | Mixon ....................... 320/160 |
| 6,522,148 B1 | 2/2003 | Ochiai et al. ............... 324/428 |
| 6,534,992 B1 | 3/2003 | Meissner et al. ........... 324/426 |
| 6,556,019 B1 | 4/2003 | Bertness .................... 324/426 |
| 6,600,237 B1 | 7/2003 | Meissner .................... 307/34 |
| 6,600,293 B1 | 7/2003 | Kikuchi ..................... 320/131 |
| 6,608,482 B1 | 8/2003 | Sakai et al. ................. 324/426 |
| 6,653,818 B1 | 11/2003 | Laig-Horstebrock et al. ........ 320/132 |
| 2002/0008495 A1 | 1/2002 | Dougherty et al. ......... 320/104 |
| 2002/0026252 A1 | 2/2002 | Wruck et al. ................ 700/90 |
| 2002/0031700 A1 | 3/2002 | Wruck et al. ................ 429/61 |
| 2003/0047366 A1 | 3/2003 | Andrew et al. ............. 2/195.1 |
| 2003/0082440 A1 | 5/2003 | Mrotek et al. .............. 429/123 |
| 2003/0142228 A1 | 7/2003 | Flach et al. ................. 348/335 |
| 2003/0236658 A1 | 12/2003 | Dougherty ................... 703/14 |
| 2004/0021466 A1 | 2/2004 | Dougherty et al. ......... 324/429 |

FOREIGN PATENT DOCUMENTS

| | | |
|---|---|---|
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99 17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR–003 Application Notes, Hermetic Switch, Inc., Highway 92, Post Office Box 2220, Chickasha, OK 73023, http://www.hermeticswitch.com/RS_frm.htm, available at least by Jan. 6, 2003 (1 page).

How It Works: Read Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pp. http://www.cotorelay.com/ReedTech.pdf, available at least by Jan. 6, 2003, 37–43.

Willibert Schleuter, *Das elektrische Ersatzschaltbild des Bleiakkumulators unter Berücksichtigung erzwungener Electrolyströmung*, etz Archiv, vol. 4 (1982), Issue 7, pp. 213–218.

Lürkens et al., *Ladezustandsschaätzuntt von Bleibatterien mit Hilfe des Kalman–Filters*, etz Archiv, vol. 8 (1986), Issue 7, pp. 231–236.

Brooke, L., "Resin Keeps Batteries Cool", A1 Inside Magazine, Nov., 1998, p. 55.

Hoover, J., "Failure Modes of Batteries Removed from Service", A Presentation at the 107th Convention of Battery Council International, Apr. 30–May 3, 1995, p. 62.

Stan Gibilisco and Neil Sclater, Co–Editors–in–Chief, "Rectifier Bridge," Encyclopedia of Electronics, 2nd Edition, TAB Professional and Reference Books, 1996, pp. 708–711.

Lehman, A., "Electrical Battery Model For Leo Application Based on Absolute Instantaneous State of Charge," Proceedings of the European Space Power Conference held in Madrid, Spain, Oct. 2–6, 1989, ESA Publications, NL, vol. 1, pp. 173–178.

Robbins, Tim & Hawkins, John, "Battery Model For Over–Current Protection Simulation of DC Distribution Systems," Telecommunications Energy Conference, 1994, Intelec '94, 16th International Vancouver, BC, Canada Oct. 30–Nov. 3, 1994, New York, NY, IEEE, pp. 307–314 XP001036407 ISBN: 0–7803–2034–4.

Mayer, D. et al., "Modelling and Analysis of Lead Acid Battery Operation," Ecole des Mines de Paris, XP010092137, pp. 1–3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1–2, pp. 69–84, XP004095174 ISSN: 0378–7753, p. 70, line 11; p. 82, line 5, figures 2, 3, 12.

Baert, D & Vervaet, A., "Lead–Acid Battery Model for the Derivation of Peukert's Law," Electrochimica Acta, Elsevier Science Publishers, Barking, GB, vol. 44, No. 20, pp. 3491–3504 XP004168624 ISSN: 0013–4686.

International Search Report for PCT/US02/19760 (International filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19–22, 1986." (6 sheets).

Bosch and the New E–Class, Electronic Battery Mangement System, Focus on Electronics, Nov. 2002 (1 sheet).

Forecast Review, The Battery Man, Nov., 1996 p. 21.

OnGuard™ XT Battery State–of–Health Monitor, 2003 Midtronics, Inc. P/N 156–983A (2 sheets).

* cited by examiner

3. Loss of acid

Fig. 3

4. Loss of mass

METHOD AND DEVICE FOR DETERMINING THE STATE OF FUNCTION OF AN ENERGY STORAGE BATTERY

BACKGROUND OF THE INVENTION

When using chargeable electrochemical energy storage batteries, for example, as starter batteries for a motor vehicle, it is desirable and in safety-critical fields of operation necessary to be able to identify the state of the energy storage battery.

One problem that occurs in this case, however, is the complexity of the processes in the rechargeable battery, which can be described only with difficulty using scientific methods. For example, DE 195 40 827 C2 discloses an empirical method for determining the state of aging of a battery, in which a battery-specific family of characteristics is predetermined for battery aging. A battery aging value is determined by detecting instantaneous values of the variables which influence battery aging in the battery being monitored, with the aid of the family of characteristics.

Furthermore, DE 199 60 761 C1 discloses a method for monitoring the residual charge and the capability of an energy storage battery to supply power, in which measurement points are determined by means of a number of current and voltage measurements with the energy storage battery in different load states, and in which intersections with a limit voltage level and limit current level are determined by means of straight interpolation lines.

One disadvantage is that these methods need to be matched to the respective physical form of the energy storage battery and to the required function of the energy storage battery by means of constants and functions which have to be determined from a large number of experiments. This applies particularly to batteries in motor vehicles with an internal combustion engine, in which the energy storage battery is subject to completely random influences in the electrical power supply system, in terms of the requirements and operating conditions to which it is subject. For example, the changes in the charging and discharge periods as well as their intensity in conjunction, for example, with the respective battery temperatures are distributed absolutely randomly and are unpredictable, owing to the random nature of the driving cycle.

A further problem is that power reserves in the energy storage battery must be ensured in order to supply safety-relevant loads, such as electrical steering and/or electrical brakes.

A method for measuring the state of health of an energy storage battery when subjected to an electrical load is disclosed in EP 1 116 958 A2. In this case, the energy storage battery has a load profile applied to it, that is to say a defined current or a power is drawn for a fixed time, and the voltage response of the energy storage battery is measured. The lowest and highest voltage values while the load profile is being applied to the energy storage battery is a measure of the state of health (SOH). As an alternative to applying a load profile to the energy storage battery, the state of health (SOH) can also be determined by computation from the state of charge SOC, the dynamic internal resistance $R_i$ and the temperature of the energy storage battery under consideration. The characteristic value for the state of health SOH describes, however, only one measure of the capability of the energy storage battery to supply an amount of energy at the required voltage level.

Furthermore, DE 199 52 693 A1 discloses a method for determining, indicating and/or reading the state of an energy storage battery, in which the battery voltage, battery temperature, charging current, discharge current and/or the no-load current are detected and a controlled variable for the generator that is used for supplying the energy storage battery is derived via the characteristic values for the state of charge SOC as a function of a no-load voltage and the battery temperature, and of the characteristic value for the state of health SOH.

The characteristic value for the state of charge SOC in this case describes the state of charge of the energy storage battery taking into account the amount of charge with which it has been charged or which has been discharged from it.

SUMMARY OF THE INVENTION

An exemplary embodiment relates to a method for determining the state of function of an energy storage battery. The method includes determining a characteristic value for the state of charge of the energy storage battery. The method also includes determining a characteristic value for the state of heath of the energy storage battery when an electrical load is placed on the energy storage battery, the state of health being the suitability of the energy storage battery to emit a specific amount of energy to the at least one load while maintaining a minimum voltage. The method further includes determining a characteristic value for the state of function by linking the characteristic values for the state of charge and for the state of health.

Another exemplary embodiment relates to a device for determining the state of an energy storage battery. The device includes measurement means configured to detect at least one of battery voltage, a battery temperature, charging and discharge currents, and no-load current. The device also includes processor-controlled evaluation means. The evaluation means is configured to determine a characteristic value for a state of health of an energy storage battery.

BRIEF DESCRIPTION OF THE DRAWINGS

The invention will be explained in more detail in the following text using the attached drawings, in which.

DETAILED DESCRIPTION OF THE PREFERRED EMBODIMENTS

The present invention relates to a method for determining the state of function of an energy storage battery, in particular a starter battery for a motor vehicle, as the capability to supply at least one load with an amount of energy, by determining a characteristic value for the state of charge of the energy storage battery and a characteristic value for the state of heath when an electrical load is placed on the energy storage battery, with the state of health being the suitability of the energy storage battery to emit a specific amount of energy to the at least one load while maintaining a minimum voltage.

The present invention also relates to a device for determining the state of an energy storage battery (e.g., a starter battery for motor vehicles) with measurement means for detecting the battery voltage, the battery temperature, the charging and discharge currents and/or the no-load current and with processor-controlled evaluation means.

One feature of the present invention is to provide a method and a device for determining a characteristic value for the state of function SOF of an energy storage battery, with the characteristic value for the state of function being a measure, beyond the state of charge SOC and the state of health SOH, for the probability of the energy storage battery being able to provide a minimum amount of energy at a time t. The characteristic value for the state of function SOF is determined by linking the characteristic values for the state of charge SOC and for the state of health SOH.

In contrast to conventional methods, the state of the energy storage battery is described by the use of theoretical probability methods, in the process of which it has been found that the two characteristic values for the state of charge and for the state of health are sufficient to predict the state of function of the energy storage battery.

In general, the characteristic values SOX as the "state of performance" for the characteristic X at the time t are defined as the ratio of the usage period of the characteristic X that is still available at the time t to the greatest possible usage period of the characteristic X:

$$SOX(t) = \frac{\text{usage period of the characteristic } X \text{ which is still available at the time } t}{\text{greatest possible usage interval of the characteristic } X}$$

The characteristic values may be defined as the probability P (t) dt that a remaining usage Δx of the characteristic X will still be available within the time t to t+dt at the time t.

In contrast to conventional analytical methods, the characteristic values SOC and SOH which identify the state of charge probability and the state of health probability are now simply logically linked.

The characteristic value for the state of charge SOC at a time t may in this case be determined, for example, from the ratio of the difference between the present charge Q(t) and a predetermined critical charge $Q_{crit}$ and the difference between the maximum charge $Q_{max}$ of the energy storage battery and the predetermined critical charge $Q_{crit}$.

The characteristic value for the state of charge SOC at a time t may, however, also be determined approximately from the Nernst state of charge $SOC_N$ from the ratio between the present no-load voltage difference between the present no-load voltage $U_0$ (t) and the critical no-load voltage $U_{0,crit}$, and the maximum no-load voltage difference between the maximum no-load voltage $U_{0,max}$ and the critical no-load voltage $U_{0,crit}$.

The critical charge $Q_{crit}$ and the critical no-load voltage $U_{0,crit}$ are limit values which are intended to ensure that loads can be supplied for a defined remaining time period dt.

Using the above Nernst approximation $SOC_N$, the state of charge SOC is, however, described with sufficient accuracy for the case of a new energy storage battery. Over the course of use of the energy storage battery, an aging effect becomes noticeable, with the quantity of the active mass which is available to the charging/discharge process according to Faraday, and/or the acid concentration, decreasing continuously, and with sulfation of the active mass possibly occurring. The maximum capacity of the energy storage battery which can be drawn from it or can be stored in it is reduced in elderly batteries. This influence is preferably taken into account by calculating the characteristic value for the state of charge SOC from the Nernst state of charge $SOC_N$ minus a characteristic value for the change in the state of charge $SCO_{NA}$ resulting from any aging-dependent change in the active mass of the energy storage battery. The characteristic value for the change in the state of charge $SOC_{NA}$ is preferably determined from the change in the state of charge resulting from a reduction in an active mass $SOC_{NAm}$ and/or from the change in the state of charge resulting from sulfation of the active mass $SOC_{NAp}$.

The characteristic value for the state of health SOH is preferably determined in a known manner from load-dependent drops in the battery voltage.

In this case, the characteristic value for the state of health SOH can be defined, by way of example, as the ratio of the difference between a present discharge voltage $U_{min}$ and the product of a predetermined critical discharge voltage $U_{crit}$ and the ratio of a characteristic value for a critical state of charge $SOC_{crit}$ to the characteristic value for the present state of charge SOC(t) to the difference between a predetermined normal discharge voltage $U_{max}$ of a corresponding energy storage battery in the new state and the product of the predetermined critical discharge voltage $U_{crit}$ and the characteristic value for the critical state of charge $SOC_{crit}$.

On the basis of the definition of the characteristic values as probability functions, the characteristic value for the state of function SOF can be calculated simply as the product of the characteristic values for the state of charge SOC and the state of health SOH. In the same way, the characteristic value for the state of charge SOC can preferably be calculated from the product of the characteristic values for the Nernst state of charge $SOC_N$ and the changes in the state of charge resulting from reductions in the active mass $SOC_{NAm}$ and/or the change in the state of charge resulting from sulfation of the active mass $SOC_{NAp}$.

In this case, the following boundary condition definitions are preferably used as basis, that the characteristic value for the state of function SOF is equal to zero when the characteristic value for the state of charge SOC is less than or equal to zero. Furthermore, the characteristic value for the state of function SOF should be zero when the characteristic value for the state of health SOH is less than or equal to zero.

The characteristic value for the state of charge SOC is preferably determined from the amount of charge which can be drawn in normal conditions at a temperature in the range from 20 to 30° C., preferably 25° C., by measurement of the discharge current which occurs when discharging a fully charged energy storage battery in the new state for a time period of 5 to 25 hours, preferably for 20 hours.

The characteristic value for the change in the state of charge $SOC_{NA}$ related to the active mass of the energy storage battery is preferably determined with the aid of the internal resistance $R_i$ of the energy storage battery.

A device may also be provided for determining the state of an energy storage battery, with processor-controlled evaluation means being designed for carrying out the above-mentioned method for determining the characteristic value of the state of health.

The characteristic value for the state of function SOF of an energy storage battery is defined as the ratio of the available energy content to reach a critical minimum energy level $E_{crit}$ related to the maximum possible usable energy content $E_{max}$.

The characteristic value for the state of function SOF is thus intended to make it possible to determine the probability with which the energy storage battery will still be able at a time t to supply an amount of energy with a quality such that a required physical amount of work $W_{crit}$ can still be carried out in accordance with a minimum power profile $P_{crit}$. By way of example, it should be possible to determine whether an electrical brake can still be operated safely with the present state of the energy storage battery.

The energy content at the time t $$E(t)=U(t) \times \Delta Q(t)$$

and the probability, which is derived from this, of still being able to supply a minimum amount of energy or critical energy $$E_{crit}=U_{crit}\Delta Q_{crit}$$

are thus critical characteristics of the energy storage battery. The characteristic value for the state of function SOF at temperature T at the time t is then defined as follows:

$$SOF_T(t) = \frac{E(t) - E_{crit}}{E_{max} - E_{crit}} = \frac{U(t) \times \Delta Q(t) - U_{crit} \times \Delta Q_{crit}}{U_{max} \times \Delta Q_{max} - U_{crit} \times \Delta Q_{crit}}$$

In general, the characteristic value SOC for the state of charge of an energy storage battery at the time t is determined as follows:

$$SOC(t) = \frac{Q(t) - Q_{min}}{Q_{max} - Q_{min}}$$

and $$SOC(t) = \frac{\Delta Q_{20}(t)}{C_{20}}$$

where Q(t) is the electrical charge which is contained in the energy storage battery and can be removed. If, by way of example, the charge Q(t) falls to the value $Q_{min}$, the characteristic value SOC(t) is equal to zero. In the fully charged state, the electrical charge Q(t) which can be drawn becomes $Q_{max}$, so that SOC(t) is then equal to 1. The characteristic value for the state of charge SOC is thus a measure of the probability that the battery will be in a specific state of charge in the time interval t to t+dt, and that an amount of charge which can be drawn in normalized discharge conditions according to Faraday's Law will still be present in the time interval t, t+dt. For example, the amount of charge $\Delta Q_{20}$ is defined as the standard parameter which can still be drawn during discharge at the 20-hour current level at room temperature before the energy storage battery reaches the discharge voltage limit of 10.5 V, and which represents the rated capacity $C_{20}$ of a new, fully charged energy storage battery whose rated voltage is 12 V.

Since, according to Faraday's Law, an electrochemical energy store also has to chemically convert an amount of mass corresponding to this in order to absorb or to emit a specific amount of energy, the characteristic value for the state of charge SOC at any time also represents the amount of active mass which is still available for conversion or, in the case of a lead-acid rechargeable battery, also the concentration of the electrolyte which is still available for the reaction.

The known Nernst's Law provides a direct relationship between the acid density, which increases or decreases in accordance with Faraday's Law (charging or discharging) and the so-called no-load voltage, that is to say the terminal voltage, for example, of the unloaded lead-acid rechargeable battery. This characteristic value for the Nernst state of charge $SOC_N$ is directly proportional, over wide sections of the relevant state of charge range, to the battery no-load voltage $U_O$ at that time. The following relationship thus applies, to a good approximation:

$$SOC_N(t) \approx \frac{U_0(t) - U_{0,min}}{U_{0,max} - U_{0,min}}$$

The characteristic value for the Nernst state of charge $SOC_N(t)$ can be equated to the general characteristic value for the state of charge SOC(t) only in the case of a new energy storage battery which has not yet been subjected to the various aging processes.

Over the course of use, an aging effect becomes noticeable, however, in every energy storage battery. The description of the aging process is extremely complex and can be estimated, for example, empirically with the aid of influencing variables such as the temperature profile, the energy throughput, and the discharge depth throughout the life.

The aging influences will be described in the following text using FIGS. 1 to 5 by way of example.

Figure 1:
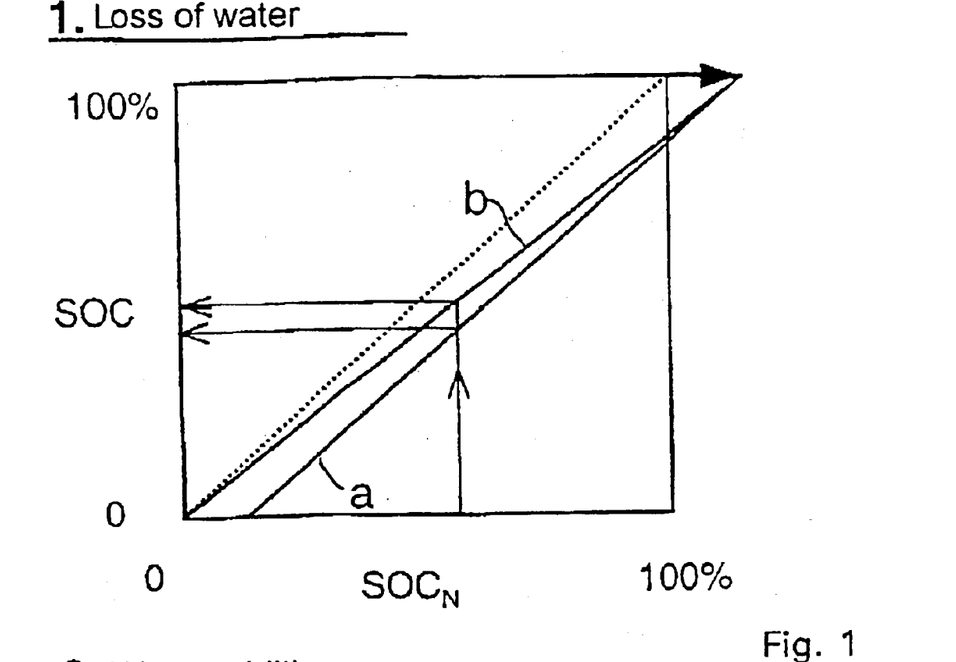
FIG. 1 shows a diagram for determining the characteristic value for the state of charge SOC with a correction for water loss.

FIG. 1 shows a diagram for determining the characteristic value for the state of charge SOC in the event of water loss. A loss of water resulting from electrolysis leads as a result of the "thickening effect" of the battery acid to a rise in the acid concentration. In the case of an energy storage battery which has large amounts of acid, this rise acts uniformly on any state of charge, so that the output ratio represented by the dashed line of the amount of energy $SOC_F$ which can actually be drawn and the Nernst state of charge $SOC_N$ are shifted parallel downwards (straight line a). In the case of an energy storage battery with low acid, the straight line which describes this ratio is just tilted downward (straight line b).

As can be seen, for the same Nernst state of charge $SOC_N$, the amount of charge which can actually be drawn from the elderly battery, that is to say the characteristic value for the state of charge SOC of the elderly battery, is less than the value as defined initially by the relationship $SOC \approx SOC_N$ for the new battery. This effect, which is particularly significant after full charging, also occurs in the partial charge area and close to the complete discharge area due to the loss or aging-dependent decrease in the active mass. However, this is true only of the group of mass-limited energy storage batteries.

Figure 2:
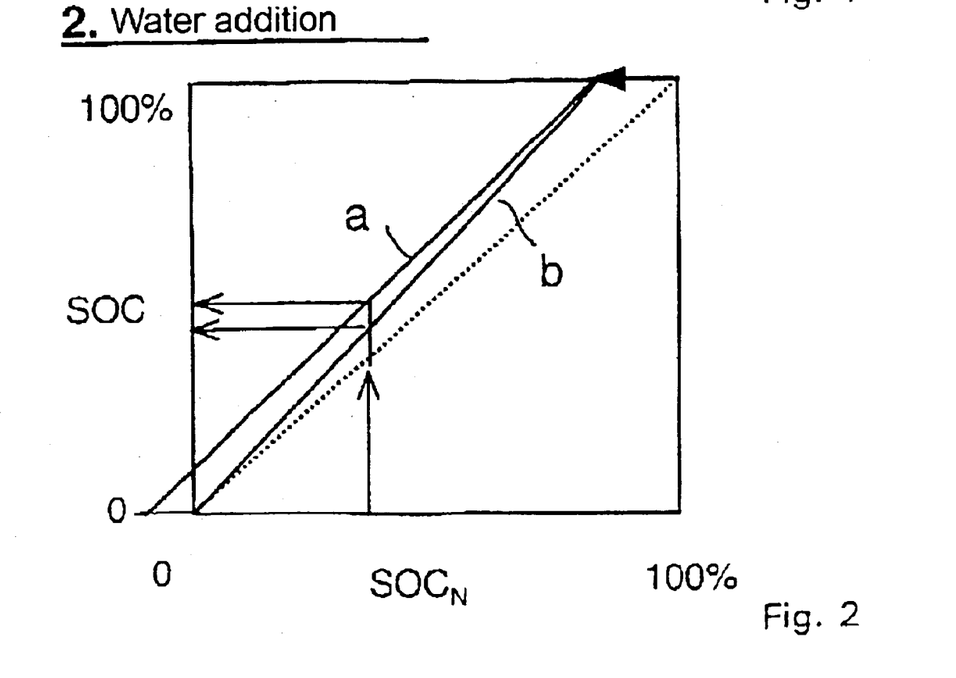
FIG. 2 shows a diagram for determining the characteristic value for the state of charge SOC with a correction for water addition.

FIG. 2 shows a diagram for determining the characteristic value for the actual state of charge SOC of the elderly energy storage battery when water is added. The addition of water decreases the acid concentration and the opposite effect to that which results from loss of water (see FIG. 1) is achieved.

Figure 3:
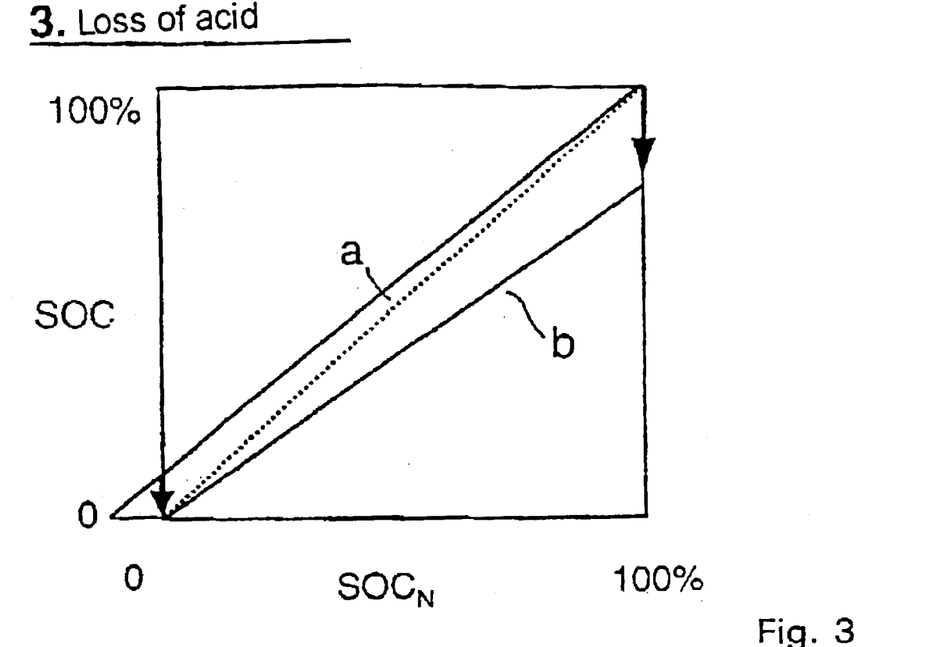
FIG. 3 shows a diagram for determining the characteristic value for the state of charge SOC with a correction for acid loss.

FIG. 3 shows a diagram for determining the characteristic value for the actual state of charge SOC of an elderly energy storage battery in the event of acid loss. In the case of an energy storage battery with large amounts of acid, the loss of acid concentration in the fully charged state has scarcely any effect. However, in the area of severe discharge, this leads, in a similar way to that in the case of water addition as sketched in FIG. 2, to an increase in the characteristic value for the actual state of charge SOC.

In the case of an energy storage battery with little acid (straight line b), any loss of acid, in contrast, leads to a reduction in the amount of charge which can actually be drawn (characteristic value SOC).

Figure 4:
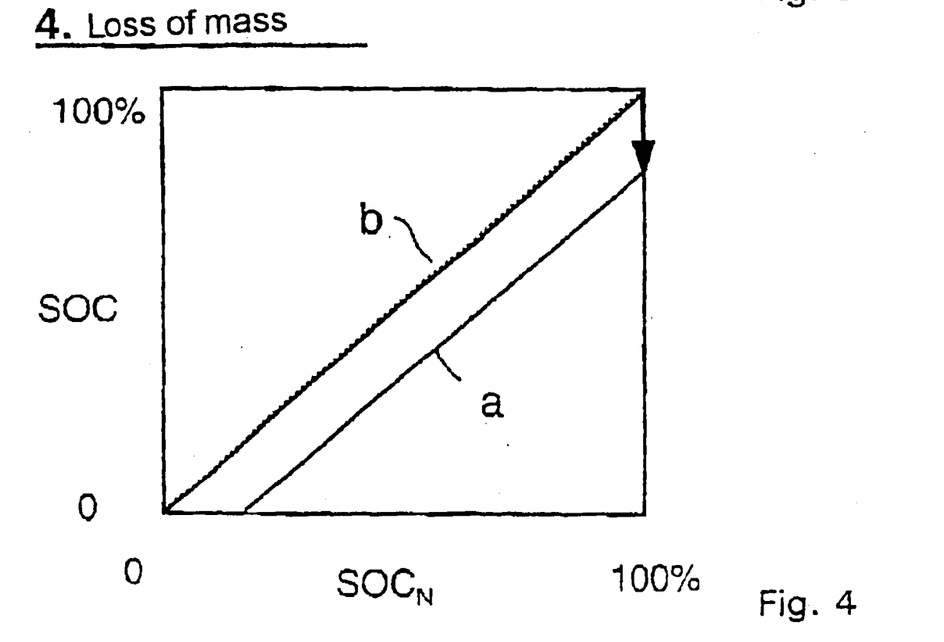
FIG. 4 shows a diagram for determining the characteristic value for the state of charge SOC with a correction for loss of active mass.

FIG. 4 shows a diagram for determining the characteristic value for the actual state of charge SOC when a mass loss occurs. In the case of an energy storage battery with little acid (straight line b), any loss of active mass has scarcely any effects on the amount of energy which can actually be drawn since, in modern energy storage batteries, the acid concentration is a major limiting factor for the amount of energy which can be drawn.

In the case of an energy storage battery which has large amounts of acid, any loss of mass on the other hand leads to a major reduction in the amount of charge which can be drawn (see straight line a), proportionally over this entire range of the characteristic value for the Nernst state of charge $SOC_N$.

Figure 5:
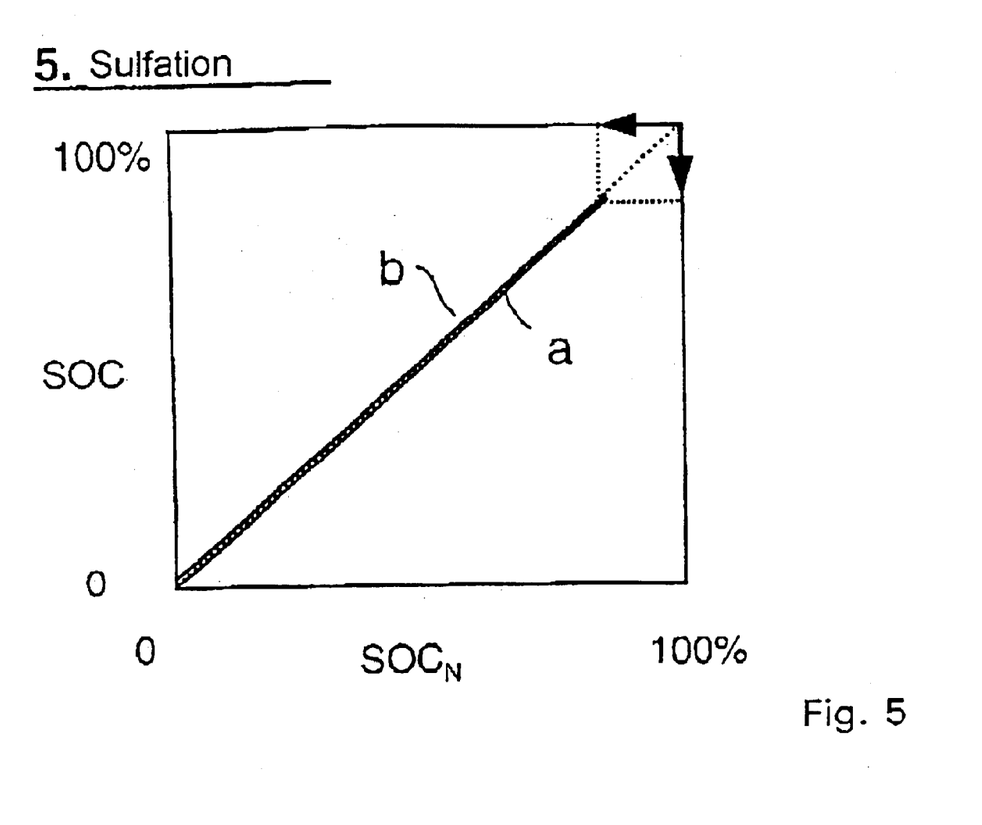
FIG. 5 shows a diagram for determining the characteristic value for the state of charge SOC with a correction for sulfation of the active mass.

FIG. 5 shows a diagram for determining a characteristic value for the actual state of charge SOC in the event of sulfation. In modern acid-limited energy storage batteries, the effect of sulfation occurs in parallel with the loss of water. This is a process which counteracts the thickening of the electrolyte, but continuously restricts the maximum battery capacity which is available for storage of electrical charge. In the case of sulfation, the proportionality between the actual amount of energy which can be drawn (characteristic value SOC) and the amount of charge in a new battery (dashed line) is still maintained. All that happens is that the maximum capacity of the energy storage battery decreases with progressive sulfation/aging.

On the basis of these relationships, it is permissible to calculate the characteristic value for the actual state of charge SOC of an energy storage battery from the product of the Nernst state of charge $SOC_N$ (which is determined via the amount of charge with which the battery has been charged or which has been discharged from the battery) and the state of charge losses resulting from changes to the critical mass (water loss, water addition, acid loss and mass loss) $SOC_{N\Delta m}$ and the characteristic value for the state of charge loss resulting from sulfation $SOC_{N\Delta p}$. The present Nernst state of charge $SOC_N$ of the energy storage battery is determined in short time periods, in the short term, using mathematical models and/or a method for current balancing, in order to monitor an energy storage battery. Furthermore, the changes in the state of charge resulting from the loss of active mass and sulfation $SOC_{N\Delta m}$ and $SOC_{N\Delta p}$ are calculated using the correlation between the present state of charge with the battery direct-current internal resistance $R_i$ at states of charge which are as low as possible and at low temperatures, for example with the aid of the differential dU/dI.

In the long term, in parallel with permanent monitoring, the difference between the determined amount of charge $SOC_N$ and the amount of charge (SOC) which is actually present in the battery is readjusted on the basis of the characteristic value for the change in the state of charge $SOC_{N\Delta m}$ and $SOC_{N\Delta p}$. In periods in which this is not possible or may be unnecessary (high states of charge, that is to say low internal resistance changes), the characteristic value for the change in the state of charge resulting from the active mass $SOC_{N\Delta m}$ and/or resulting from sulfation $SOC_{N\Delta p}$ must be determined by mathematical models on the basis of the calendar operating time as well as the cumulative battery charge throughput that has already occurred by this time, at the respective electrolyte temperatures, using so-called aging functions.

In the long term, the characteristic value for the state of health SOH is likewise determined from the difference between the voltage drop observed at the moment when a load is applied, for example when steering or starting, and a voltage drop measured in the new state, for a given state of charge and temperature.

The product of the characteristic values for the Nernst state of charge $SOC_N$, the change in the state of charge resulting from the active mass $SOC_{N\Delta m}$ and the change in the state of charge resulting from sulfation $SOC_{N\Delta p}$ and the characteristic value for the state of health SOH can then be used to determine the probability with which, in given conditions, it will still be possible to supply a load with a defined load profile. One condition may, for example, be that a specific number of steering operations are possible with electrical support from the starter battery of a motor vehicle.

This probability is referred to as the characteristic value for the state of function SOF and is used, for example, to decide whether to initiate further measures in the vehicle up to and including producing an alarm for the driver.

By substituting the critical amount of charge $\Delta Q_{crit}$ which would be required for safe and reliable operation of a specific electrical appliance, for example for braking on n occasions with the voltage level being at least $U_{crit}$, by the expression $$\Delta Q_{crit} = \Delta Q_{max} \Delta SOC_{crit}$$

and $$\Delta Q = \Delta Q_{max} \times SOC(t),$$

then the characteristic value for the state of function can be calculated to be:

$$SOF(t) = SOC(t) \times \frac{U(t) - U_{crit} \times \frac{SOC_{crit}}{SOC(t)}}{U_{max} - U_{crit} \times SOC_{crit}}$$

This results in a definition according to the invention for the characteristic value for the state of health SOH as follows:

$$SOH(t) = \frac{U(t) - U_{crit} \times \frac{SOC_{crit}}{SOC(t)}}{U_{max} - U_{crit} \times SOC_{crit}}$$

When determining the characteristic value for the state of function by logically linking the characteristic value for the state of charge SOC and the characteristic value for the state of health SOH, it must be remembered that SOC must be greater than or equal to $SOC_{crit}$.

In the equations, $U_{max}$ denotes the maximum system voltage, U(t) the present system voltage, and $U_{crit}$ the critical system voltage. This allows an energy storage battery to be monitored in a simple manner.

Priority application DE 102 10 516.2 filed on Mar. 9, 2002, including the specification, drawings, claims, and abstract, is incorporated herein by reference in its entirety.

It is important to note that the construction and arrangement of the in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. Other substitutions, modifications, changes and omissions may be made in the design, operating conditions and arrangement of the preferred and other exemplary embodiments without departing from the scope of the present invention.

What is claimed:

1. A method for determining the state of function of an energy storage battery, the method comprising:
   determining a characteristic value for the state of charge of the energy storage battery;
   determining a characteristic value for the state of heath when an electrical load is placed on the energy storage battery, the state of health being the suitability of the energy storage battery to emit a specific amount of energy to the at least one load while maintaining a minimum voltage; and
   determining a characteristic value for the state of function by linking the characteristic values for the state of charge and for the state of health.

2. The method of claim 1, wherein the characteristic value for the state of charge is determined from the ratio of the difference between the present charge and a predetermined critical charge and the difference between the maximum charge of the energy storage battery and the predetermined critical charge being given by the equation.

$$\left(SOC(t) \approx \frac{Q(t) - Q_{crit}}{Q_{max} - Q_{crit}}\right).$$

3. The method of claim 1, wherein the characteristic value for the state of charge is determined from a Nernst state of charge as the ratio of the difference between present no-load voltage and critical no-load voltage to the difference between maximum no-load voltage and the critical no-load voltage.

4. The method of claim 3, wherein the characteristic value for the state of charge is determined from the Nernst state of charge minus a characteristic value for the change in the state of charge resulting from an age-dependent change to an active mass of the battery.

5. The method of claim 4, wherein the characteristic value for the change in the state of charge is determined from a change in the state of charge resulting from any reduction in the active mass.

6. The method of claim 4, further comprising determining a characteristic value relating to the active mass of the energy storage battery for the change in the state of charge by determining the internal resistance ($R_i$) of the energy storage battery.

7. The method of claim 1, wherein the characteristic value for the state of health is determined from load-dependent drops in battery voltage.

8. The method of claim 1, wherein the characteristic value for the state of health is given by the equation:

$$\left(SOH(t) = \frac{U(t) - U_{crit} \times \frac{SOC_{crit}}{SOC(t)}}{U_{max} - U_{crit} \times SOC_{crit}}\right)$$

where U(t) is the present discharge voltage, $U_{crit}$ is the critical discharge voltage, $SOC_{crit}$ is the characteristic value for the state of charge, SOC(t) is the characteristic value for the present state of charge, and $U_{max}$ is the predetermined normal discharge voltage of a corresponding energy storage battery in a new state.

9. The method of claim 1, wherein the characteristic value for the state of function is the product of the characteristic values for the state of charge and for the state of health.

10. The method of claim 1, wherein the characteristic value for the state of function is equal to zero when the characteristic value for the state of charge is less than or equal to zero.

11. The method of claim 1, wherein the characteristic value for the state of function is equal to zero when the characteristic value for the state of health is less than or equal to zero.

12. The method of claim 1, wherein the characteristic value for the state of charge is determined from the amount of charge which can be drawn in normal conditions at a temperature in the range from 20° C. to 30° C. by measuring discharge current which occurs when discharging a fully charged energy storage battery in a new state for a time period of between 5 and 25 hours.

13. A device for determining the state of an energy storage battery comprising:
   measurement means configured to detect at least one of battery voltage, a battery temperature, charging and discharge currents, and no-load current; and
   processor-controlled evaluation means;
   wherein the evaluation means are configured to determine a characteristic value for a state of health of an energy storage battery; and
   wherein the evaluation means is also configured to determine a characteristic value for a state of charge of the energy storage battery, the characteristic value for the state of charge being determined from a Nernst state of charge as the ratio of the difference between present no-load voltage and critical no-load voltage to the difference between maximum no-load voltage and the critical no-load voltage.

14. The device of claim 13, wherein the characteristic value for the state of charge is determined from the Nernst state of charge minus a characteristic value for the change in the state of charge resulting from an age-dependent change to an active mass of the battery.

15. The device of claim 14, wherein the characteristic value for the change in the state of charge is determined from a change in the state of charge resulting from any reduction in the active mass and from the change in the state of charge resulting from sulfation of the active mass.

16. The device of claim 15, wherein the evaluation means also determines a characteristic value relating to the active mass of the energy storage battery for the change in the state of charge by determining the internal resistance ($R_i$) of the energy storage battery.

17. The device of claim 13, wherein the characteristic value for the state of health is determined from load-dependent drops in battery voltage.

18. The device of claim 13, wherein the characteristic value for the state of health is given by the equation:

$$\left(SOH(t) = \frac{U(t) - U_{crit} \times \frac{SOC_{crit}}{SOC(t)}}{U_{max} - U_{crit} \times SOC_{crit}}\right)$$

where U(t) is the present discharge voltage, $U_{crit}$ is the critical discharge voltage, $SOC_{crit}$ is the characteristic value for the state of charge, SOC(t) is the characteristic value for the present state of charge, and $U_{max}$ is the predetermined normal discharge voltage of a corresponding energy storage battery in a new state.

19. The device of claim 13, wherein the device is configured to determine a state of function of the energy storage battery as the product of the characteristic values for the state of charge and for the state of health.

20. A device for determining the state of an energy storage battery comprising:
- measurement means configured to detect at least one of battery voltage, a battery temperature, charging and discharge currents, and no-load current; and
- processor-controlled evaluation means;
- wherein the evaluation means are configured to carry out a method comprising:
  - determining a characteristic value for the state of charge of the energy storage battery;
  - determining a characteristic value for the state of heath of energy storage battery when an electrical load is placed on the energy storage battery, the state of health being suitability of the energy storage battery to emit a specific amount of energy to the at least one load while maintaining a minimum voltage; and
  - determining a characteristic value for the state of function by linking the characteristic values for the state of charge and for the state of health.

* * * * *

UNITED STATES PATENT AND TRADEMARK OFFICE
CERTIFICATE OF CORRECTION

PATENT NO. : 6,885,951 B2
DATED : April 26, 2005
INVENTOR(S) : Gerolf Richter It is certified that error appears in the above-identified patent and that said Letters Patent is hereby corrected as shown below:

Column 9,
Line 6, delete "heath" and insert therefor -- health --.
Line 38, delete the "." after "mass" and insert therefor -- and from the change in the state of charge resulting from sulfation of the active mass. --.

Signed and Sealed this

Twenty-fifth Day of October, 2005

JON W. DUDAS
*Director of the United States Patent and Trademark Office*